United States Patent [19]

Takemura

[11] Patent Number: 5,061,971

[45] Date of Patent: Oct. 29, 1991

[54] BI-BASED OXIDE SUPERCONDUCTING TUNNEL JUNCTIONS AND MANUFACTURING METHOD FOR THE SAME

[75] Inventor: Yasuhiko Takemura, Atsugi, Japan

[73] Assignee: Semiconductor Energy Laboratory Co., Ltd., Kanagawa, Japan

[21] Appl. No.: 406,061

[22] Filed: Sep. 12, 1989

[30] Foreign Application Priority Data

Sep. 22, 1988 [JP] Japan ................................ 63-239256

[51] Int. Cl.$^5$ ...................... H01L 27/12; H01L 39/22; H01L 49/02
[52] U.S. Cl. ........................................... 357/5; 357/4; 357/6
[58] Field of Search ....................... 357/5, 4, 6; 505/1; 365/162

[56] References Cited

U.S. PATENT DOCUMENTS 4,768,069 8/1988 Talvacchio et al. .................... 357/5

FOREIGN PATENT DOCUMENTS

| 0282012 | 9/1988 | European Pat. Off. | 357/5 |
| 0325877 | 8/1989 | European Pat. Off. | 357/5 |
| 57-159074 | 10/1982 | Japan | 357/5 |

OTHER PUBLICATIONS

M. A. Subramanian et al., "A New High-Temperature Superconductor: $Bi_2Sr_{3-x}Ca_xCu_2O_{8+y}$" Science (Feb. 26, 1988), pp. 1015-1017.

Primary Examiner—J. Carroll
Attorney, Agent, or Firm—Sixbey, Friedman, Leedom & Ferguson

[57] ABSTRACT

Josephson junctions have been formed from superconducting oxide ceramic materials conforming to the formula of $Bi_2Sr_2Ca_{n-1}Cu_nO_{2n+4}$ (n=1, 2, 3, ...). The tunnel junction is made from an oxide ceramic film conforming to the formula of $Bi_2Sr_{1-x}Ca_xO_y$ ($1 \leq x \leq$, $3 \leq y \leq 4$). In light of the similarity of the crystal line structures, the good alignment is established between the superconducting ceramic and the barrier film and superconducting ceramic material having a high degree of crystallinity can be deposited on the barrier film with improved superconductive property.

2 Claims, 3 Drawing Sheets

BI-BASED OXIDE SUPERCONDUCTING TUNNEL JUNCTIONS AND MANUFACTURING METHOD FOR THE SAME

BACKGROUND OF THE INVENTION

The present invention relates to oxide superconducting tunnel junctions and manufacturing method for the same.

Josephson devices are superconducting electric devices which have been actually used in the field such as in the form of SQUID. The device operates based on the Josephson effect which takes place along a tunnel junction. On the other hand, superconducting oxide ceramics have attracted the interests of scientists as promising the future superconducting device such as switching devices for supercomputer which can operate at liquid nitrogen temperature.

In order to form a Josephson junction, a barrier film has to be interposed between superconducting regions. The thickness of the junction is on the order of the coherent length of superconducting carriers. While the coherent lengths in metal superconductors are of the order of several hundreds of angstroms, the coherent lengths in oxide ceramic superconductors are of the order of several tens of angstroms. It means that the thickness of the barrier film have to be 100 Å or less.

The difficulties in forming Josephson junction is attributed partially to the fact that ceramic superconducting crystals are hardly deposited on a barrier film such as MgO or $Al_2O_3$, which usually has a different crystalline structure than the superconducting ceramic. Namely, when forming a lower superconducting film, a barrier film and an upper superconducting film stacked in this order, the superconductivity of the upper superconducting film is degraded because of its poor crystallinity ensuring from the influence of the underlying barrier film.

SUMMARY OF THE INVENTION

It is therefore an object of the present invention to provide superconducting tunnel junctions and a manufacturing method for the same without degrading the superconducting property of the superconducting region deposited on the barrier film.

In order to accomplish the above and other objects and advantages, the present invention proposes to fabricate, between superconducting ceramic films, a barrier film forming a Josephson junction from an oxide ceramic which has a similar structure as the superconducting ceramic films. In case of superconducting ceramics represented by the general formula $Bi_2Sr_2Ca_{n-1}Cu_nO_{2n+4}$ (n=1, 2, 3, . . . ), nonsuperconducting $Bi_2Sr_{1-x}Ca_xO_y$ ($0 \leq x1$, $3 \leq y \leq 4$) can be used to form a barrier film between films made of the superconducting ceramic. A lower film of the superconducting ceramic is formed on a suitable substrate such as a single crystalline Mg substrate or a substrate made of the nonsuperconducting ceramic. A barrier film of the nonsuperconducting ceramic is formed on the lower superconducting film. An upper superconducting film of the superconducting ceramic is further formed on the barrier film. The laminating process can progress epitaxially. The a-axis of the superconducting ceramic and the a-axis of the nonsuperconducting ceramic are both 5.4 angstroms.

The similarity of the adjacent superconducting and barrier films in crystalline structure makes it possible to deposit the superconducting ceramic on the barrier film with a high degree of crystallinity and without degrading the superconductivity of the superconducting ceramic.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 1:
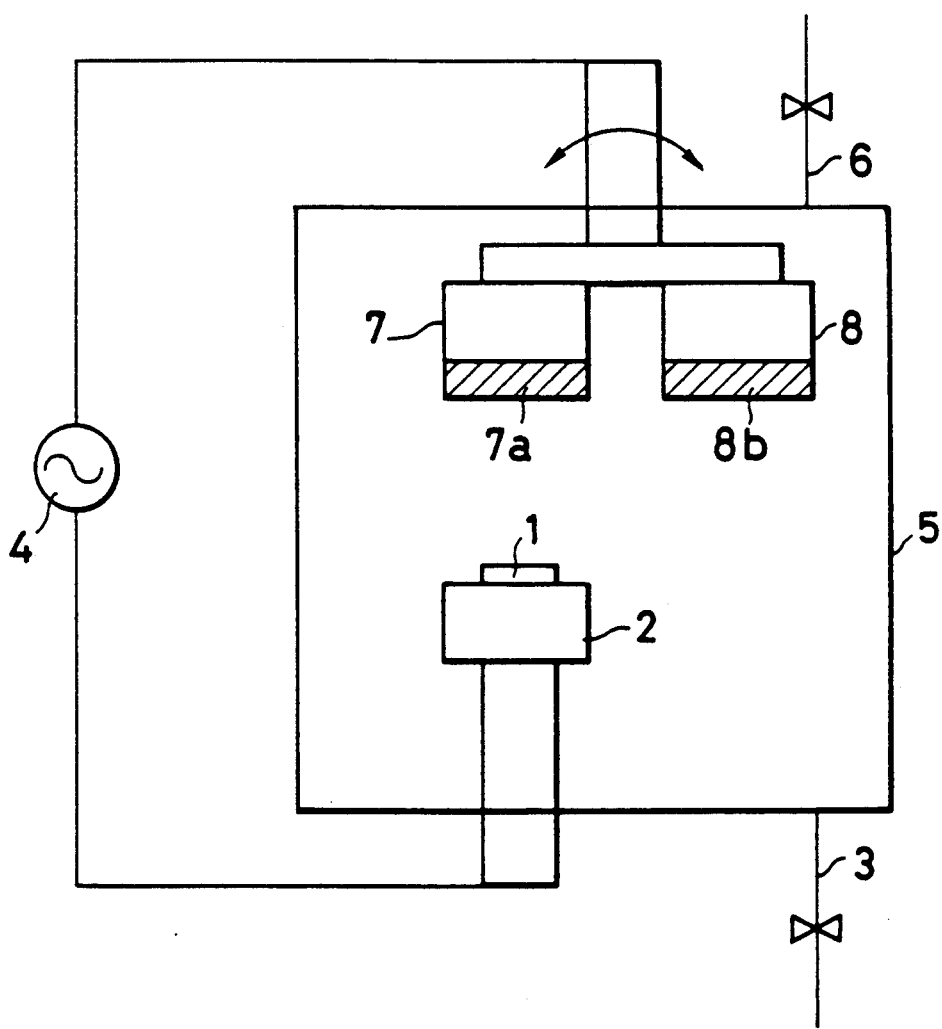
FIG. 1 is a schematic diagram showing a sputtering apparatus for use in forming superconducting tunnel junctions in accordance with the present invention.

Referring now to FIG. 1, an RF sputtering apparatus for forming superconducting devices in accordance with the present invention is illustrated. The apparatus comprises a vacuum chamber 5, a gas feeding system 6, an evacuating system 3, a target holder comprising two stages 7 and 8, a substrate holder 2 functioning also as a heater, and an AC power source 4. The stages of the target holder can be interchanged through rotation in order to select either of the two targets mounted on the respective stages.

Figure 2A:
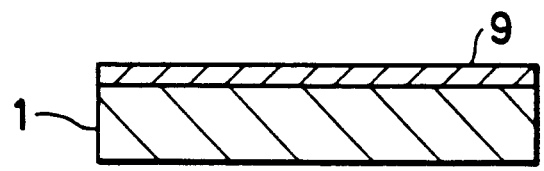
FIGS. 2(A) to 2(C) are cross sectional views showing a method of forming superconducting tunnel junctions in accordance with the present invention.
Figure 2B:
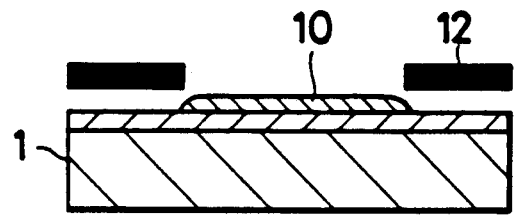
Figure 2C:
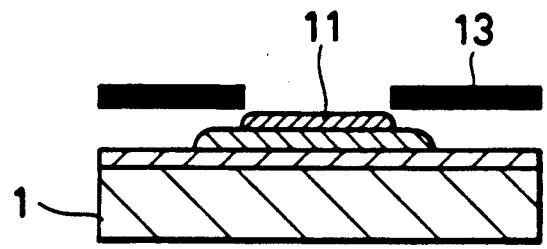

A single crystalline Mg substrate is mounted on the holder in order to provide its (100) plane as the upper surface. On the stage 7 of the holder is mounted a target 7a made of $Bi_3SrO_y$ ($3 \leq y \leq 4$). Another target 8a made of $Bi_2Sr_2CaCu_3O_9$ is mounted on the other stage 8. Argon and oxygen are introduced at 1:1 so that the total pressure in the chamber is 100 mile Torr with the aid of the evacuating system 2. In this condition, AC electric energy is inputted to the chamber. The target 7 becomes disintegrated due to bombardment of ions accelerated by the AC energy resulting in the deposition of $Bi_2Sr_2CaCu_2O_8$ on the Mg substrate 1. FIGS. 2(A) to 2(C) illustrate schematics of this process. The thickness of the superconducting ceramic film 9 of the $Bi_2Sr_2CaCu_2O_8$ was 2000 Å. Since there occurs some difference between the compositions of the target 7 and the deposited material, the target has been prepared, taking it into account, in order to compensate the difference. Next, the other target 8 of $Bi_3SrO_y$ is located to be sputtered in place of the target 7a. A $Bi_2SrO_y$ film 10 is deposited in the same manner on a predetermined portion of the surface of the $Bi_2Sr_2CaCu_2O_8$ film 9 with a first mask 12 being aligned in a suitable position relative to the substrate 1 (FIG. 2(B)). Furthermore, after the target 7a made of $Bi_2Sr_2CaCu_3O_9$ is located in the sputtering position again and the first mask 12 is replaced by a second mask 13, a superconducting $Bi_2Sr_2CaCu_2O_8$ film 11 is deposited on the film 10 (FIG. 2(C)). The dimension of the film 11 is smaller than that of the film 10 to avoid the connection between the films 9 and 11.

Figure 3:
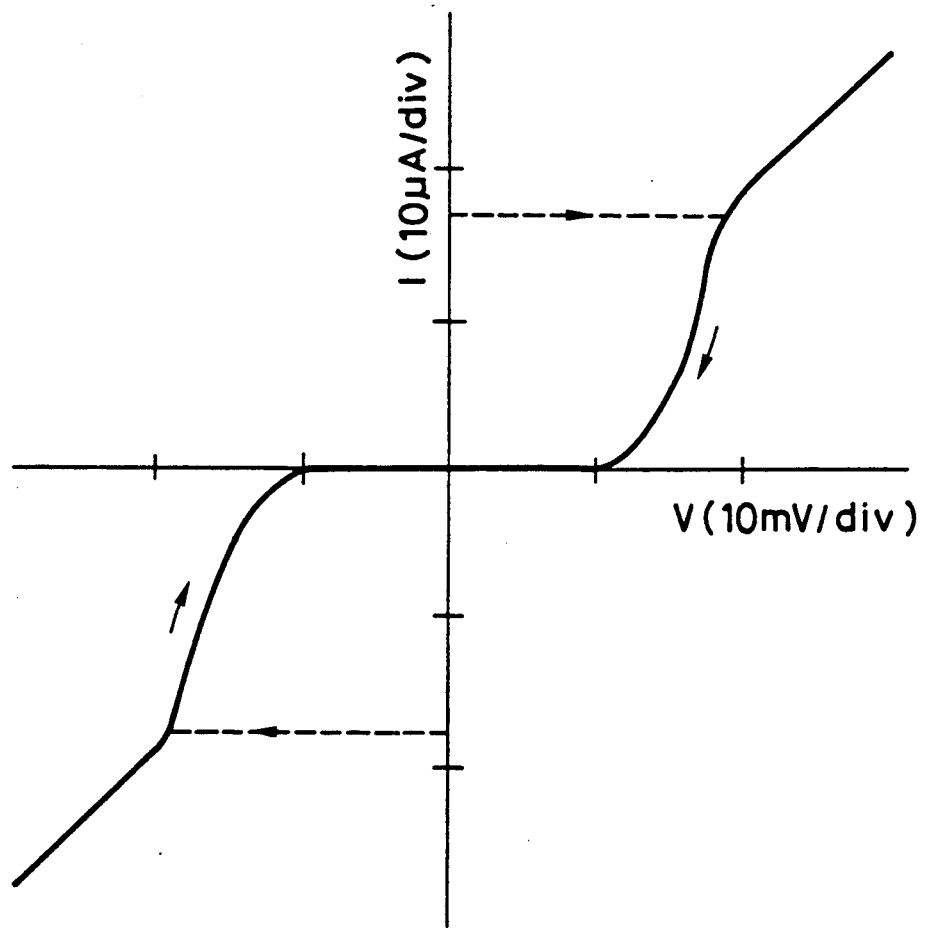
FIG. 3 is a graphical diagram showing V-I curve of the device formed in accordance with the present invention.

In accordance with experiments, a high degree of crystallinity of the superconducting film 11 being in alignment with the nonsuperconducting film 10 was confirmed by the X-ray diffraction, the electron beam diffraction and the RHEED pattern. It was also confirmed that the tunnel junction formed across the film 10 exhibited the DC and AC Josephson effects at liquid nitrogen temperature. The I-V curve is depicted in FIG. 3 which has been plotted with the Josephson junction at 80° K. The characteristics of the Josephson junction can be improved by annealing the whole structure at 300°-700° C. The annealing further expedites the crystalline alignment between the films. It is also effective to anneal each of the superconducting films in an oxidizing atmosphere just after the completion of the formation of each film in order to improve the superconductivity of the film.

While several embodiments have been specifically described by way of examples, it is to be appreciated that the present invention is not limited to the particular examples described and that modifications and variations can be made without departing from the scope of the invention as defined by the appended claims.

What is claimed is:

1. A Bi-based superconducting tunnel junction comprising:

a pair of crystalline superconducting oxide ceramic regions, each comprising Bi, Sr, Ca, Cu and O; and a crystalline barrier film located between said pair of superconducting oxide ceramic regions, said barrier film being made of ceramic material conforming to $Bi_2Sr_{1-x}Ca_xO_y$ ($0 \leq x \leq 1$, $3 \leq y \leq 4$), wherein a well-aligned interface is established between said barrier film and each of said superconducting regions.

2. A tunnel junction as in claim 1, wherein the composition of said oxide ceramic conforms to $Bi_2Sr_2Ca_{n-1}Cu_nO_{2n+4}$ where n is a positive integer equal to 1, 2 or 3.

* * * * *